(12) United States Patent
Farooq et al.

(10) Patent No.: US 6,339,527 B1
(45) Date of Patent: Jan. 15, 2002

(54) THIN FILM CAPACITOR ON CERAMIC

(75) Inventors: Mukta S. Farooq; John U. Knickerbocker, both of Hopewell Junction; Srinivasa S. N. Reddy, Lagrangeville; Robert A. Rita, Wappingers Falls; Roy Yu, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/470,456

(22) Filed: Dec. 22, 1999

(51) Int. Cl.[7] .................. H01G 4/008; H01G 4/228
(52) U.S. Cl. .............. 361/305; 361/306.3; 361/311; 257/303; 438/396
(58) Field of Search .............. 361/301.1, 301.4, 361/303, 305, 306.1, 311, 312, 321.1; 257/301, 303, 306, 532–535; 438/386, 387, 393, 396

(56) References Cited

U.S. PATENT DOCUMENTS

| | | |
|---|---|---|
| 3,819,990 A | 6/1974 | Hayashi et al. |
| 3,988,824 A | 11/1976 | Bodway |
| 4,364,099 A | 12/1982 | Koyama et al. |
| 4,453,199 A | 6/1984 | Ritchie et al. |
| 4,931,897 A | 6/1990 | Tsukamoto et al. |
| 5,005,102 A * | 4/1991 | Larson ........................ 361/313 |
| 5,568,352 A * | 10/1996 | Hwang .................... 361/321.4 |
| 5,576,928 A * | 11/1996 | Summerfelt et al. ..... 361/321.1 |
| 5,652,693 A | 7/1997 | Chou et al. |
| 5,685,968 A | 11/1997 | Hayakawa et al. |
| 5,807,774 A | 9/1998 | Desu et al. |
| 6,023,407 A * | 2/2000 | Farooq et al. .............. 361/303 |

\* cited by examiner

*Primary Examiner*—Anthony Dinkins
*Assistant Examiner*—Eric W. Thomas
(74) *Attorney, Agent, or Firm*—Margaret A. Pepper

(57) ABSTRACT

The capacitor on a ceramic substrate one by unique film metallization including in one embodiment an in situ oxidation of titanium to create a metal oxide capacitor. The combination of metals when used with the appropriate optimized oxidation conditions and parameters ensures a high yielding capacitor with high capacitance in absence of noble metals and with ease of manufacture providing a low cost, high yield capacitor on ceramic.

20 Claims, 1 Drawing Sheet

THIN FILM CAPACITOR ON CERAMIC

BACKGROUND OF THE INVENTION

1. Field of the Invention:

The present invention relates to the formation of thin film capacitors and more particularly to the formation of thin film capacitors on a ceramic substrate.

2. Description of the Prior Art:

It is desirable to place thin film capacitors on ceramic substrates particularly multilevel ceramic substrates having through vias. It is highly desirable to provide low inductance and low parasitic decoupling capacitance at the chip interconnection points. Ideally this capacitor should be joined to the substrate below and to an integrated circuit chip on top. This joining may be by controlled collapsed chip connections or other techniques.

Typical thin film process steps include a platinum electrode deposition followed by sputtered dielectric deposition on a ceramic base substrate. The sputtered dielectric film is often very thin, about 3,000 A and it is intrinsically highly stressed. In combination with imperfections on this ceramic surface, this leads to electrical shorts in the formed thin film capacitors. Techniques to improve the thin film capacitor are related to 1) improving the surface characteristics of the ceramic surface to the point where the overlying thin films are deposited in a perfectly smooth manner without imperfections; or 2) to make thin film structure robust enough to handle a certain level of defects in the ceramic yet stay free of electrical shorts.

To aid in manufacturability with low cost, it is desirable to form the thin film capacitor by placing it directly on a substrate with high yield and with high capacitance.

SUMMARY OF THE INVENTION

The present invention uses a unique thin film metallization scheme on ceramic following by in situ oxidation to create a metal oxide capacitor. The combination of metals when used with the appropriate optimized oxidation conditions ensures a high yield of good capacitors each having high capacitance value.

The process is to deposit an adhesion layer followed by a metal electrode which is followed by a diffusion barrier, then a dielectric material. A top electrode is formed to complete the capacitor.

In one embodiment, a dielectric material may be deposited on the diffusion barrier or in a second embodiment, the dielectric material may be formed by oxidation of a metal placed on top of the diffusion barrier which provides a self-healing of any pin holes within the dielectric material to prevent electrical shorts.

BRIEF DESCRIPTION OF THE DRAWINGS

The foregoing and other objects, aspects and advantages will be better understood from the following detailed description of a preferred embodiment of the invention with reference to the drawings, wherein.

DESCRIPTION OF THE PREFERRED EMBODIMENT

Figure 1:
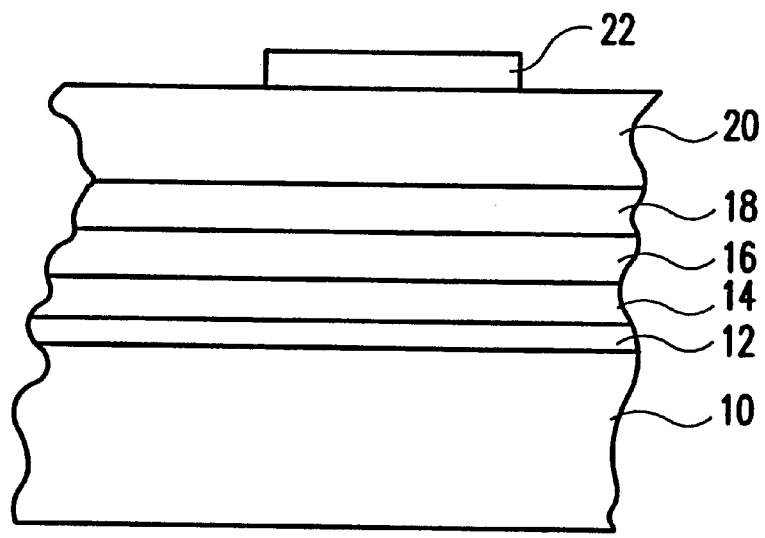
FIG. 1 illustrates in a sectional view of a thin film capacitor embodying the present invention.

Referring to FIG. 1 a chromium layer 12 is deposited on a glass ceramic substrate 10. The Cr layer provides adhesion for the subsequent metallization to be formed on the glass ceramic substrate 10. It is desirable that the adhesion layer be on the nature of 200 to 250 A and may be, as an example, a flash deposition of chromium via sputtering or evaporation techniques.

On top of the adhesion layer is formed the bottom electrode which may be copper 14 in the thickness range of 1 to 3 microns, nominally about 2$\mu$m. The bottom electrode 14 may be deposited by various techniques such as RF sputter deposition, electro-plating or vacuum deposition techniques. On top of the bottom electrode is deposited a nickel diffusion barrier layer 16, which may be on the order of 1 to 3$\mu$ thick. The Ni layer 16, protects the copper from oxidation. Next, a layer of titanium 18, is deposited on the nickel layer 16. The thickness of the Ti is in the range of 0.1 to 1.0 microns.

In one embodiment, shown in FIG. 1, a layer of barium zirconium titanate (BZT) 20, may be deposited to provide the high dielectric constant material to form a capacitor. As an alternative, barium strontium titanate (BST) may be used as the high dielectric material. The dielectric layer is in the range of 500 to 3000 Angstroms thick depending on the capacitance desired and smoothness of the underlying layers.

The dielectric layer 20, is annealed at a temperature of approximately 650 degrees C to optimize its dielectric properties. Following the anneal, a top electrode of platinum or titanium and copper 22 is used to make electrical contact to the upper electrode of the capacitor. Standard lithographic steps are used to pattern ground and power electrodes, and to remove the high dielectric material from areas where signal transmission has to occur, for example the via locations.

Figure 2:
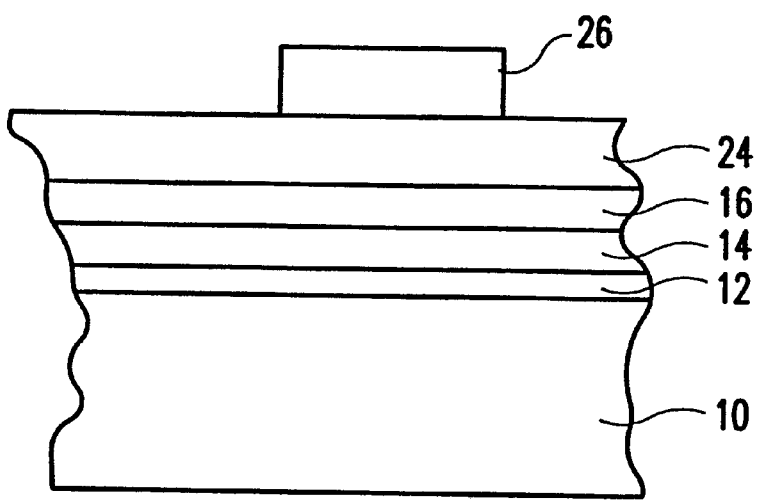
FIG. 2 illustrates an alternative embodiment of the present invention employing oxidation of the metal to form the dielectric material.

In an alternative embodiment shown in FIG. 2, after the base layers of chromium 12, copper 14, and nickel 16 are first deposited on a glass ceramic substrate 10, a layer of titanium 24, about 0.5 microns thick is deposited. The titanium is oxidized using an air anneal at temperatures in the range of 650 to 850 degrees C. Optimal results were obtained with a 700° C. anneal for 60 minutes for a 0.5 thick Ti layer 24.

Tantalum or ruthenium or other similar metal may be substituted for the titanium. The capacitance values for various metal substitutes may be experimentally determined under varying thickness and oxidation conditions.

The top electrode 26, for the second embodiment may be chromium copper evaporated through a metal mask or may be patterned by subsequent lithography.

The invention creates a robust system because the structure is subjected to in situ conversion of metal such as titanium to a dielectric, such as titanium oxide which prevents flaws from becoming defects which may short the capacitor. Additionally, the nickel metallization below the titanium dielectric converts to a self-limiting oxide in the first few atomic layers and prevents further diffusion of oxygen through it to the copper layer below. Thus, the copper remains in a metallic form and acts as a conducting electrode. Extremely high temperatures, those exceeding 850° C. could activate the diffusion of oxygen through the nickel oxide and should be avoided.

The yield of the thus formed capacitors is very high. There is compensation for the thin film defects whether they arise from the underlying substrate, such as a ceramic substrate, or from the thin film processes themselves, which could lead to crack or breaks which are oxidized during the titanium oxide dielectric formation. Upon measurement of the capacitance versus frequency, there was found to be very little roll-off at higher frequencies.

What has been shown is a capacitor on ceramic which may be formed without the use of noble metal electrodes such as platinum, gold or silver yet having high yield and low cost.

Having thus described the present invention and its preferred embodiments in detail, it will be readily apparent to those skilled in the art that further modifications to the invention may be made without departing from the spirit and scope of the invention as presently claimed.

What is claimed is:

1. A thin film capacitor formed on a ceramic substrate comprising:
    a lower electrode adhesion layer formed on said ceramic substrate;
    a lower electrode layer formed on said lower electrode adhesion layer;
    a lower electrode diffusion barrier layer formed on said lower electrode layer, wherein said diffusion barrier layer is formed of nickel;
    a titanium metal layer formed on said lower electrode diffusion barrier layer;
    a dielectric material deposited on said titanium metal layer thereby forming a dielectric layer; and
    an upper electrode layer formed on said dielectric layer.

2. The thin film capacitor as recited in claim 1 wherein said dielectric material is selected from a group comprising barium titanate, strontium titanate, zirconium titanate, and titanium oxide.

3. The thin film capacitor as recited in claim 1 wherein said dielectric material is selected from a group consisting of barium titanate, strontium titanate, zirconium titanate, and titanium oxide.

4. The thin film capacitor as recited in claim 1 wherein said dielectric material is a combination of one or more members of a group consisting of barium titanate, strontium titanate, zirconium titanate, and titanium oxide.

5. The thin film capacitor as recited in claim 1, wherein said lower electrode diffusion barrier layer has a thickness of about 1 to about 3 micrometers.

6. A thin film capacitor formed on a ceramic substrate comprising:
    a lower electrode adhesion layer formed on said ceramic substrate;
    a lower electrode layer formed on said electrode adhesion layer;
    a lower electrode diffusion barrier layer formed on said lower electrode layer, wherein said lower electrode diffusion barrier layer is formed of nickel;
    a titanium metal layer formed on said lower electrode diffusion barrier layer;
    a dielectric layer comprising titanium oxide, wherein said dielectric layer is formed by oxidation of said titanium metal layer; and
    an upper electrode layer formed on said dielectric layer.

7. The thin film capacitor as recited in claim 6, wherein said lower electrode diffusion barrier layer has a thickness of about 1 to about 3 micrometers.

8. A thin film capacitor formed on a ceramic substrate comprising:
    a lower electrode adhesion layer formed on said ceramic substrate;
    a lower electrode layer on said lower electrode adhesion layer;
    a lower electrode diffusion barrier layer formed on said lower electrode layer, wherein said lower electrode diffusion barrier layer is formed of nickel;
    a tantalum metal layer formed on said lower electrode diffusion barrier layer;
    a dielectric layer comprising tantalum oxide, wherein said dielectric layer is formed by oxidation of said tantalum metal layer; and
    an upper electrode layer formed on said dielectric layer.

9. The thin film capacitor as recited in claim 8, wherein said lower electrode diffusion barrier layer has a thickness of about 1 to about 3 micrometers.

10. A thin film capacitor formed on a ceramic substrate comprising:
    a lower electrode adhesion layer formed on said ceramic substrate;
    a lower electrode layer formed on said lower electrode adhesion layer;
    a lower electrode diffusion barrier layer formed on said lower electrode layer, wherein said lower electrode diffusion barrier layer is formed of nickel;
    a ruthenium metal layer formed on said lower electrode diffusion barrier layer;
    a dielectric material deposited on said ruthenium metal layer thereby forming a dielectric layer; and
    an upper electrode layer formed on said dielectric layer.

11. The thin film capacitor as recited in claim 7 wherein said dielectric material is selected from a group comprising barium titanate, strontium titanate, zirconium titanate, and titanium oxide.

12. The thin film capacitor as recited in claim 10 wherein said dielectric material is selected from a group consisting of barium titanate, strontium titanate, zirconium titanate, and titanium oxide.

13. The thin film capacitor as recited in claim 10 wherein said dielectric material is a combination of one or more members of a group consisting of barium titanate, strontium titanate, zirconium titanate, and titanium oxide.

14. The thin film capacitor as recited in claim 10, wherein said lower electrode diffusion barrier layer has a thickness of about 1 to about 3 micrometers.

15. A method of making a thin film capacitor comprising the steps of
    depositing an adhesion layer on a ceramic substrate;
    depositing a metal electrode layer on said adhesion layer;
    depositing a diffusion barrier layer on said metal electrode layer, wherein said diffusion barrier layer is formed of nickel;
    depositing a dielectric material on said diffusion barrier layer; and
    providing a top electrode layer.

16. The method of making a thin film capacitor as recited in claim 15 wherein said step of depositing a dielectric material on said diffusion barrier layer further comprises depositing a metal on said diffusion barrier layer and allowing said metal to oxidize.

17. The method of making a thin film capacitor as recited in claim 16 wherein said metal is selected from a group comprising titanium and tantalum.

18. The method of making a thin film capacitor as recited in claim 16 wherein said metal is selected from a group consisting of titanium and tantalum.

19. The method of making a thin film capacitor as recited in claim 16, wherein said metal is oxidized using an air anneal at a temperature of about 650° C. to about 850° C.

20. The method of making a thin film capacitor as recited in claim 15, wherein said diffusion barrier layer has a thickness of about 1 to about 3 micrometers.

* * * * *